(12) United States Patent
Zhu et al.

(10) Patent No.: US 11,827,781 B2
(45) Date of Patent: Nov. 28, 2023

(54) PHOTOSENSITIVE RESIN COMPOSITION AND USE THEREOF

(71) Applicant: ZHEJIANG FIRST ADVANCED MATERIAL R&D INSTITUTE CO., LTD., Hangzhou (CN)

(72) Inventors: Gaohua Zhu, Hangzhou (CN); Weijie Li, Hangzhou (CN); Rongbai Tong, Hangzhou (CN); Weiqiang Qian, Hangzhou (CN); Guangda Zhou, Hangzhou (CN); Jianhua Lin, Hangzhou (CN)

(73) Assignee: Zhejiang First Advanced Material R&D Institute Co., Ltd., Hangzhou (CN)

( * ) Notice: Subject to any disclaimer, the term of this patent is extended or adjusted under 35 U.S.C. 154(b) by 89 days.

(21) Appl. No.: 17/436,628

(22) PCT Filed: Jul. 10, 2020

(86) PCT No.: PCT/CN2020/101205
§ 371 (c)(1),
(2) Date: Sep. 6, 2021

(87) PCT Pub. No.: WO2021/036538
PCT Pub. Date: Mar. 4, 2021

(65) Prior Publication Data
US 2022/0145072 A1 May 12, 2022

(30) Foreign Application Priority Data

Aug. 29, 2019 (CN) .......................... 201910805259.6
Aug. 29, 2019 (CN) .......................... 201910805266.6

(51) Int. Cl.
| | | |
|---|---|---|
| C08L 69/00 | (2006.01) | |
| C08G 64/02 | (2006.01) | |
| C08G 64/06 | (2006.01) | |
| G03F 7/033 | (2006.01) | |

(52) U.S. Cl.
CPC .......... *C08L 69/00* (2013.01); *C08G 64/0208* (2013.01); *C08G 64/0291* (2013.01); *C08G 64/06* (2013.01); *G03F 7/033* (2013.01)

(58) Field of Classification Search
CPC . C08L 69/00; C08G 64/0208; C08G 64/0291; C08G 64/06; G09F 7/033; G09F 7/004; G09F 7/027; C08F 265/06; C09D 4/06
See application file for complete search history.

(56) References Cited

U.S. PATENT DOCUMENTS

| | | |
|---|---|---|
| 6,855,480 B2 | 2/2005 | Wheeler et al. |
| 8,809,414 B2 | 8/2014 | Ide et al. |
| 2015/0024326 A1* | 1/2015 | Nawrocki ............... G03F 7/038 430/280.1 |
| 2019/0352441 A1* | 11/2019 | Lee ....................... C09D 133/12 |

FOREIGN PATENT DOCUMENTS

| | | |
|---|---|---|
| CN | 1384399 A | 12/2002 |
| CN | 108490737 A | 9/2018 |
| CN | 10515271 A | 11/2019 |
| CN | 110488570 A | 11/2019 |

* cited by examiner

*Primary Examiner* — Jessica M Roswell
(74) *Attorney, Agent, or Firm* — Olive Law Group, PLLC

(57) ABSTRACT

The present disclosure discloses a photosensitive resin composition and a use the same. The resin composition of the present disclosure includes 40-70 parts by weight of an alkali-soluble resin, 20-50 parts by weight of a photopolymerizable monomer, 0.5-10.0 parts by weight of a photoinitiator, and 0.1-10.0 parts by weight of additives. The photopolymerizable monomer includes 0.5-15.0 parts by weight of a monomer containing carbonate structure. The photosensitive resin composition is used as a dry film resist.

12 Claims, No Drawings

PHOTOSENSITIVE RESIN COMPOSITION AND USE THEREOF

CROSS REFERENCE TO RELATED APPLICATIONS

This application is a national stage application of PCT International Patent Application No. PCT/CN2020/101205, filed Jul. 10, 2020, which claims priority to Chinese Patent Application No. 201910805259.6, filed Aug. 29, 2019, and Chinese Patent Application No. 201910805266.6, filed Aug. 29, 2019; the contents of which are incorporated herein by reference in their entireties.

TECHNICAL FIELD

The present disclosure belongs to the technical field of printed circuit boards (PCB), and particularly, relates to a photosensitive resin composition and a use thereof.

BACKGROUND

In the manufacturing process of printed circuit boards, photosensitive resin compositions are widely used. The photosensitive resin composition can produce a polymerization reaction after ultraviolet irradiation to form a stable substance to adhere to the board surface, thereby becoming a resist material in the electroplating and etching processes. With the continuous increase of the data volume of information transmission, the function of PCB is correspondingly increased, the size of the parts is getting smaller and smaller, and the update frequency of the new generation of intelligent electronic products is becoming more and more frequent. This puts forward higher requirements for the high-definition, high-density, and high-efficiency productivity of printed circuit boards. This puts forward higher requirements on the resolution, adhesion, development time and film strip rate of the photosensitive resist layer used for circuit pattern transfer. Film stripping is an indispensable process in the production of printed circuit boards. After the circuit is formed, the photosensitive resist layer is peeled off the board surface with an alkaline solution. The cleanliness and film strip speed on the board surface directly affect the production efficiency and product yield of the subsequent processes.

In order to improve production efficiency, it is necessary to improve the film strip time and efficiency. Excessive film strip time will directly affect productivity and the next process steps, resulting in low efficiency. If the film strip is not clean, that is some of the resist layer remains on the board surface after the film strip, it will result in poor etching and increased scrap rate. Faster film strip time and no residue on film stripping will help shorten the product production cycle and reduce production costs. The use of amine organic stripping solution can increase the stripping time and reduce the stripping residue, but the production cost will increase correspondingly and it is harmful to the environment. Increasing the stripping spray pressure is beneficial to improve the stripping efficiency, but because the FPC is thin and easy to bend, increasing the spray pressure of the film will cause it to fold, deform, or even jam and cause it to be scrapped.

In order to improve the film strip performance of dry film resists, researchers have done a lot of research. Generally, the film strip performance can be improved by increasing the acid value and the content of hydrophilic groups in the photosensitive resin. The patent document CN108490737A regulates the amount of ethylene oxide-propylene oxide block copolymer and the molar amount of ethylenic unsaturated double bonds in the photopolymerizable monomer to prepare a dry film resist with the characteristics of easy breakage and fast film strip, but there is still room for improvement in adhesion. Patent document CN102144189B provides a photosensitive resin composition, which is modified by adding ethylene oxide to polyoxyethylene (tris(1-phenylethyl))phenyl ether, and its resolution, adhesion, and aperture covering performance are excellent, but there is still room for improvement in peeling performance.

SUMMARY

In summary, the present disclosure has developed a photosensitive resin composition in view of the above-mentioned defects of the existing dry film resist and market demand. When the resin composition is used as a dry film resist, the film is easy to break and degrade with small fragments, fast stripping speed, and excellent flexibility.

In order to solve the defects in the prior art, the object of the present disclosure is to provide a photosensitive resin composition and its use.

The photosensitive resin composition of the present disclosure contains a carbonate structure monomer. The monomer is able to produce a long polymer chain with a carbonate structure after light reaction. The carbonate structure in the long chain can be quickly react with the strong alkaline sodium hydroxide or potassium hydroxide stripper, to realize the cleavage of the long polymer chain of the carbonate structure to generate carbon dioxide. Therefore, when the photosensitive resin composition of the present disclosure is used as a dry film resist, it has characteristics such as easy breakage of film strip, smaller film strip fragments, and fast film strip speed, and at the same time, it does not affect circuit resolution and adhesion.

In addition, in another technical solution of the present disclosure, a plasticizer containing a carbonate structure may be added to the photosensitive resin composition, so that the prepared resin composition has excellent flexibility when used as a dry film resist. When removing the film, the functional group of the carbonate structure can react with the strong alkaline sodium hydroxide or potassium hydroxide stripper, and the carbonate structure reacts with hydroxide ions to decompose to generate carbon dioxide and small molecules, such that the dry film resist can swell, break and peel off quickly from the copper board. Therefore, when the photosensitive resin composition of the present disclosure is used as a dry film resist, it has the characteristics such as easy breakage of film strip, smaller film strip fragments, and fast film strip speed, such that production efficiency and product yield can be effectively improved.

In order to achieve the above objectives, the present disclosure adopts the following technical solutions:

A photosensitive resin composition comprises 40-70 parts by weight of an alkali-soluble resin, 20-50 parts by weight of a photopolymerizable monomer, 0.5-10.0 parts by weight of a photoinitiator, and 0.1-10.0 parts by weight of additives; in the photosensitive resin composition, the photopolymerizable monomer comprises 0.5-15.0 parts by weight of a monomer containing a carbonate structure, and/or the additives comprises 0.1-8.0 parts by weight of a plasticizer containing a carbonate structure.

Further, the monomer containing a carbonate structure is one or more of the following three general structures:

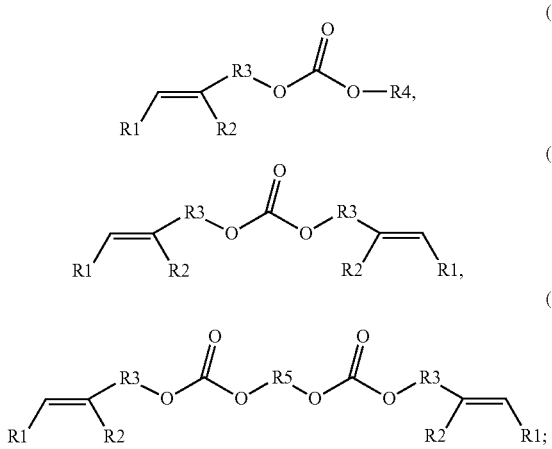

wherein, in the above general formulas (1), (2) and (3), R1 is hydrogen or phenyl; R2 is hydrogen or methyl; R3 is 1,4-phenylene, or an alkylene group with 1~10 carbon atoms; R4 is a straight or branched chain alkyl group with 1-10 carbon atoms, or an alkenyl group with 2-10 carbon atoms; R5 is selected from a group consisting of a linear or branched alkylene group with 1~10 carbon atoms, an arylene group with 6~10 carbon atoms, or a linear or branched alkylene group with 1~10 carbon atoms in which acyclic —CH2— is optionally substituted by —O—, —S— or 1,4-phenylene, and an arylene group with 6~10 carbon atoms in which acyclic —CH2— is optionally substituted by —O—, —S— or 1,4-phenylene.

Further, R4 of the general formula (1) is more preferably methyl, ethyl, or tert-butyl; R5 is more preferably methyl, ethyl, 1,4-phenylene.

Further, the weight part of the monomer containing the carbonate structure is preferably 0.5-15.0 parts by weight, and more preferably 1.0-12.0 parts by weight in consideration of film strip time and film size. If the weight part is less than 0.5, it will obviously affect the film strip time; if the weight part is higher than 15.0, the size of the film is too small, which is not conducive to the collection and treatment of waste film debris.

Further, the monomer containing carbonate structure is selected one or more from cinnamyl methyl carbonate, tert-butyl allyl formate, tert-Butyl 4-vinyl phenyl carbonate, allyl methyl carbonate, bis(2-methylallyl) carbonate, and allyl diethylene glycol dicarbonate.

Further, the plasticizer containing a carbonate structure has a structural formula as shown in general formula (4):

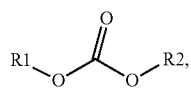

wherein, R1 and R2 are independently selected from C1-C10 linear or branched chain alkyl, C3-C10 cycloalkyl, C4-C10 alkylcycloalkyl or cycloalkylalkyl, phenyl, benzyl, C6-C10 aryl groups, C4-C10 heteroaryl groups, C2-C10 heterocyclic groups, or C2-C20 ester-containing groups; and the acyclic —CH2— in the above groups is capable to be optionally substituted by —O—, —CO—, —NH—, —S— or 1,4-phenylene.

Further, in the general formula (4), R1 and R2 are independently preferably phenyl, benzyl, C6-C10 aryl, C4-C10 heteroaryl, C4-C10 straight chain or branched alkyl groups, the acyclic —CH2— in these groups may be optionally substituted by —O—, —CO—, —NH—, —S— or 1,4-phenylene.

Further, the plasticizer containing carbonate structure is one or more selected from a group consisting of diphenyl carbonate, dibutyl carbonate, dibenzyl carbonate, bis(2-methoxyphenyl) carbonate, benzyl phenyl carbonate, benzyl methyl carbonate and tert-butyl phenyl carbonate.

Further, the plasticizer containing a carbonate structure is preferably 0.1-8.0 parts by weight, more preferably 1.0-6.0 parts by weight in consideration of film strip effect. If the weight part is less than 0.1, it will obviously affect the film strip time; if the weight part is higher than 8.0, the size of the film is too small, which is not conducive to the collection and treatment of waste film debris.

Further, the alkali-soluble resin is formed by copolymerization of at least two of methacrylic acid, methyl (meth)acrylate, ethyl (meth)acrylate, butyl (meth)acrylate, 2-ethylhexyl (meth)acrylate, 2-hydroxyethyl (meth)acrylate, benzyl (meth)acrylate, styrene, and styrene derivatives.

Further, the alkali-soluble resin is prepared by solution polymerization or suspension polymerization.

Further, the alkali-soluble resin has a weight-average molecular weight of 20,000 to 150,000, and a acid value of 100 to 350 mg KOH/g. Preferably, the weight average molecular weight of the alkali-soluble resin is 30,000-120,000, and the acid value is 120-250 mg KOH/g. When the acid value is less than 100 mg KOH/g, the alkali solubility tends to be poor, and the film strip time tends to be longer. When it exceeds 400 mg KOH/g, the resolution tends to be poor.

The weight part of the alkali-soluble resin is preferably 40-70 parts by weight. If the weight part is less than 40 parts, the photosensitive resin composition is likely to overflow and is difficult to store; if the weight part is higher than 70 parts, it will affect the risk of low sensitivity and poor resolution.

Further, the photopolymerizable monomer includes an ethylenically unsaturated double bond monomer. Preferably, the photopolymerizable monomer comprises one or more selected from a group consisting of lauryl (meth)acrylate, stearyl (meth)acrylate, nonylphenol acrylate, ethoxylated (propoxylated) nonylphenol acrylate, isobornyl ester, tetrahydrofuran methyl acrylate, bisphenol A di(meth)acrylate, ethoxylated (propoxylated) bisphenol A di(meth)acrylate, polyethylene glycol (propylene glycol) di(meth)acrylate, ethoxylated (propoxylated) neopentyl glycol diacrylate, trimethylolpropane tri(meth)acrylate, ethoxylated (propoxylated) trimethylolpropane tri(meth)acrylate, pentaerythritol triacrylate, pentaerythritol tetraacrylate, dipentaerythritol pentaacrylate, and dipentaerythritol hexaacrylate.

The weight part of the above-mentioned photopolymerizable monomer is preferably 20-50 parts by weight. If the weight part is less than 20 parts, the photosensitive resin composition is likely to cause problems of low sensitivity and low resolution; if the weight part is more than 50 parts, then the photosensitive layer will easily overflow.

Further, the photopolymerizable initiator is one or more selected from a group consisting of benzoin ether, benzophenone and derivatives thereof, thioxanthone-based compounds, anthraquinone and derivatives thereof, thioxanthone series compounds, and hexaarylbisimidazole series compounds.

Further, the photoinitiator is selected from a group consisting of 2-(o-chlorophenyl)-4,5-diphenylimidazole dimer, 2-(o-chlorophenyl)-4,5-bis(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, etc., preferably 2,2',4-tris(2-chlorophenyl)-5-(3,4-Dimethoxyphenyl)-4',5'-diphenyl-1,1'-diimidazole. In addition, one or more selected from a group consisting of thioxanthone, benzoin phenyl ether, benzophenone, benzoin methyl ether, N,N'-tetramethyl-4,4'-diaminobenzophenone, N,N'-tetraethyl-4,4'-diaminobenzophenone, 4-methoxy-4'-dimethylaminobenzophenone, 2-benzyl-2-dimethylamino-1-(4-morpholinylphenyl)-butanone, 2-ethylanthraquinone, phenanthrenequinone, 2-tert-butylanthraquinone, octamethylanthraquinone, 1,2-benzoanthraquinone, 2,3-benzoanthraquinone, 2,3-diphenyl anthraquinone, 1-chloroanthraquinone, 2-methylanthraquinone, 1,4-naphthoquinone, 9,10-phenanthrenequinone, 2,3-dimethylanthraquinone, benzoin methyl ether, benzoin ethyl ether, benzoin phenyl ether, benzil dimethyl ketal and other benzyl derivatives, 9-phenyl acridine, 1,7-bis(9,9'-acridinyl)heptane and other acridine derivatives, N-phenylglycine, coumarin-based compounds, oxazole-based compounds, and the like.

Further, the additives comprise one or more selected from a group consisting of a plasticizer, a defoamer, and a polymerization inhibitor.

The present disclosure also provides a use of the above photosensitive resin composition as a dry film resist.

The present disclosure has the following technical characteristics:

The photosensitive resin composition of the present disclosure comprises a monomer containing carbonate structure and/or a plasticizer containing carbonate structure, the photopolymerization thereof can obtain a long-chain polymer containing carbonate structure. When the resin composition is used as a dry film resist, it has excellent flexibility, when stripping (or removing) the film, and it can quickly react with the strong alkaline sodium hydroxide or potassium hydroxide stripper to realize the carbonate structure of the polymer long chain or a breakage of the plasticizer containing carbonate structure; it can be decomposed to generate carbon dioxide and small molecules, so that the dry film resist swells and breaks, and quickly peels off from the copper board. Therefore, when the photosensitive resin composition of the present disclosure is used as a dry film resist, it has the characteristics such as easy breakage of film strip, smaller film strip fragments, faster film strip speed, excellent flexibility, and at the same time, it has good circuit resolution and adhesion, such that the production efficiency and product yield can be effectively improved.

DESCRIPTION OF EMBODIMENTS

To make the objectives, technical solutions, and advantages of the embodiments of the present disclosure clearer, the technical solutions of the embodiments of the present disclosure will be described clearly and completely below. Obviously, the described embodiments are a part of the embodiments of the present disclosure, rather than all of the embodiments. Based on the described embodiments of the present disclosure, all other embodiments obtained by a person of ordinary skill in the art without inventive work shall fall within the protection scope of the present disclosure.

Unless otherwise defined, the technical or scientific terms used in the present disclosure shall have the usual meanings understood by those with ordinary skills in the field to which the present disclosure belongs.

1. Specific components and the weight ratios thereof in the photosensitive resin compositions of Examples (Ex.) 1-18 and Comparative Examples (Cp. Ex.) 1-4 (see Table 1 and Table 2)

(1) Alkali-soluble resin A: it is prepared by solution polymerization; the main components may be methacrylic acid/methyl methacrylate/n-butyl methacrylate/lauryl acrylate/styrene=22/40/15/5/18 (Mw=80,000).

(2) Photopolymerizable monomer B:
B-1: (8) ethoxylated nonylphenol acrylate, with a molecular weight of 626 (Sartomer);
B-2: (9) ethoxylated dimethacrylate, with a molecular weight of 598 (Bigen);
B-3: (3) ethoxylated trimethylolpropane triacrylate, with a molecular weight of 428 (Sartomer);
B-4: allyl diethylene glycol dicarbonate, (Hubei Guangao Biological Technology Co., Ltd.);
B-5: allyl methyl carbonate, (Hubei Guangao Biological Technology Co., Ltd.);
B-6: bis (2-methylallyl) carbonate, (Hubei Guangao Biological Technology Co., Ltd.).

(3) Photoinitiator C:
C-1: 2,2',4-tris(2-chlorophenyl)-5-(3,4-dimethoxyphenyl)-4',5'-diphenyl-1,1'-diimidazole (Tronly, Changzhou);
C-2: N-Phenylglycine (Xiya Chemistry).

(4) Additives D:
D-1: brilliant green pigment (J&K Scientific, Shanghai);
D-2: leuco crystal violet (J&K Scientific, Shanghai);
D-3: tribromomethyl phenyl sulfone (TCI Shanghai);
D-4: N,N-diethylhydroxylamine (J&K Scientific, Shanghai);
D-5: dibenzyl carbonate (Hubei Guangao Biological Technology Co., Ltd.);
D-6: benzyl phenyl carbonate (Hubei Guangao Biological Technology Co., Ltd.);
D-7: tert-butyl phenyl carbonate (Hubei Guangao Biological Technology Co., Ltd.).

TABLE 1

The weight ratio of each component of Example (Ex.) 1-9 and Comparative Example (Cp. Ex.) 1-2

| Component (w %) | | Ex. 1 | Ex. 2 | Ex. 3 | Ex. 4 | Ex. 5 | Ex. 6 | Ex. 7 | Ex. 8 | Ex. 9 | Cp. Ex. 1 | Cp. Ex. 2 |
|---|---|---|---|---|---|---|---|---|---|---|---|---|
| Alkali-soluble resin | A | 50 | 50 | 50 | 50 | 50 | 50 | 60 | 40 | 70 | 60 | 50 |
| Photo-polymerizable monomer | B-1 | 20 | 20 | 20 | 20 | 20 | 25 | 19 | 49.5 | 5 | 16 | 5 |
| | B-2 | 10 | 10 | 10 | 10 | 9 | 9 | 10 | — | — | 10 | 10 |
| | B-3 | 9.5 | 9.5 | 9.5 | 9.5 | 7.5 | 8 | 9 | — | — | 10.5 | 11.5 |

TABLE 1-continued

The weight ratio of each component of Example (Ex.) 1-9 and Comparative Example (Cp. Ex.) 1-2

| Component (w %) | | Ex. 1 | Ex. 2 | Ex. 3 | Ex. 4 | Ex. 5 | Ex. 6 | Ex. 7 | Ex. 8 | Ex. 9 | Cp. Ex. 1 | Cp. Ex. 2 |
|---|---|---|---|---|---|---|---|---|---|---|---|---|
| | B-4 | 7 | — | — | 3.5 | 10 | 5 | 1.3 | 0.5 | 7.5 | — | 20 |
| | B-5 | — | 7 | — | 3.5 | — | — | 0.1 | — | 7.5 | — | — |
| | B-6 | — | — | — | — | — | — | — | — | — | — | — |
| Photo-initiator | C-1 | 2 | 2 | 2 | 2 | 1.5 | 1.2 | 0.5 | 2.5 | 2.5 | 2 | 2 |
| | C-2 | 0.5 | 0.5 | 0.5 | 0.5 | 1 | 0.8 | - | 2.5 | 2.5 | 0.5 | 0.5 |
| Additives | D-1 | 0.05 | 0.05 | 0.05 | 0.05 | 0.1 | 0.1 | 0.05 | 0.6 | 0.6 | 0.05 | 0.05 |
| | D-2 | 0.4 | 0.4 | 0.4 | 0.4 | 0.6 | 0.9 | 0.05 | 1.7 | 1.7 | 0.4 | 0.4 |
| | D-3 | 0.5 | 0.5 | 0.5 | 0.5 | 0.3 | — | — | 2.0 | 2.0 | 0.5 | 0.5 |
| | D-4 | 0.05 | 0.05 | 0.05 | — | — | — | — | 0.7 | 0.7 | 0.05 | 0.05 |
| Total: | | 100 | 100 | 100 | 100 | 100 | 100 | 100 | 100 | 100 | 100 | 100 |

TABLE 2

The weight ratio of each component of Examples 10-18 and Comparative Example 3-4

| Component (w %) | | Ex. 10 | Ex. 11 | Ex. 12 | Ex. 13 | Ex. 14 | Ex. 15 | Ex. 16 | Ex. 17 | Ex. 18 | Cp. Ex. 3 | Cp. Ex. 4 |
|---|---|---|---|---|---|---|---|---|---|---|---|---|
| Alkali-soluble resin | A | 57 | 57 | 57 | 57 | 54 | 60 | 40 | 70 | 60 | 60 | 60 |
| Photo-polymerizable monomer | B-1 | 17 | 17 | 17 | 17 | 21 | 16 | 50 | 5 | 20 | 16 | 5 |
| | B-2 | 10 | 10 | 10 | 10 | 9 | 9 | — | 10 | — | 10 | 10 |
| | B-3 | 9.5 | 9.5 | 9.5 | 9.5 | 7.5 | 7.5 | — | 5 | — | 10.5 | 11.5 |
| Photo-initiator | C-1 | 2 | 2 | 2 | 2 | 2 | 2 | 0.5 | 1 | 3 | 2 | 2 |
| | C-2 | 0.5 | 0.5 | 0.5 | 0.5 | 0.5 | 0.5 | — | 1 | 7 | 0.5 | 0.5 |
| Additives | D-1 | 0.05 | 0.05 | 0.05 | 0.05 | 0.05 | 0.05 | 0.5 | 0.1 | 0.5 | 0.05 | 0.05 |
| | D-2 | 0.4 | 0.4 | 0.4 | 0.4 | 0.4 | 0.4 | 3.2 | 0.5 | 1.5 | 0.4 | 0.4 |
| | D-3 | 0.5 | 0.5 | 0.5 | 0.5 | 0.5 | 0.5 | 3.0 | 0.5 | 3 | 0.5 | 0.5 |
| | D-4 | 0.05 | 0.05 | 0.05 | 0.05 | 0.05 | 0.05 | 2.7 | 0.5 | — | 0.05 | 0.05 |
| | D-5 | 3 | — | — | 1.5 | 5 | 4 | 0.1 | 3 | — | — | 10 |
| | D-6 | — | 3 | — | 1.5 | — | — | — | 3.4 | 5 | — | — |
| | D-7 | — | — | 3 | — | — | — | — | — | — | — | — |
| Total: | | 100 | 100 | 100 | 100 | 100 | 100 | 100 | 100 | 100 | 100 | 100 |

2. Preparation of photosensitive dry film of Examples and Comparative Examples

The specific preparation steps may be as follows:

(1) mixing the components according to the proportions of the components of the photosensitive resin composition in Table 1 and Table 2, then adding acetone; and fully stirring until completely dissolved, such that a resin composition solution with a solid content of 40% can be obtained;

(2) coating the above resin composition solution evenly on the surface of a PET support film with a thickness of 15 μm by using a coater, and placing the coated PET support film in an oven at 85° C. for 10 minutes to form a dry film resist layer with a thickness of 35μm, which appears blue-green under a yellow light;

(3) attaching a polyethylene film protective layer with a thickness of 20 μm to the surface of the dry film resist layer, such that a photosensitive dry film with a three-layer structure can be obtained.

3. Sample preparation methods (including filming, exposing, developing, etching, and stripping (removing) film), sample evaluation methods and evaluation results of Examples and Comparative Examples.

(1) Sample Preparation Method

Filming:

polishing the copper clad laminate on its copper surface by a grinder, washing with water, and wiping to obtain a bright and fresh copper surface; setting the pressure roller temperature of the film laminator to 110° C., the conveying speed to 1.5 m/min, and heat bonding under standard pressure.

Exposing:

exposing the sample by using Zhisheng Technology M-552 parallel light exposure machine, after standing for more than 15 minutes after filming, performing a photosensitivity test with stouffer 41-step exposure ruler, where the number of exposure grids may be controlled at 16-22 grids, and the exposure energy may be 25-60 mJ/cm$^2$.

Developing:

standing the sample for more than 15 minutes after exposing, and washing the developed sample with water and drying; where the developing temperature may be 30° C., the pressure may be 1.2 Kg/cm$^2$, the developing solution may be a 1% wt sodium carbonate aqueous solution, and the developing time may be 1.5-2.0 times the minimum developing time.

Etching:

etching with acid; where the etching solution may be a copper chloride (CuCl$_2$)/hydrochloric acid (HCL) system, the etching temperature may be 50° C., the pressure may be 1.2 Kg/cm$^2$, the specific gravity of the etching solution may be 1.20-1.30 g/mL, the concentration of hydrochloric acid may be 1.5 mol/L, and the concentration of copper ion may be 120-160 g/L.

Film Stripping:

removing (stripping) the film and washing with water and drying; where the stripper may be NaOH, the concentration may be 3.0 wt %, the temperature may be 50° C., the pressure may be 1.2 Kg/cm$^2$, and the stripping time may be 1.5-2.0 times the minimum stripping Time.

(2) Evaluation Method

Stripping Speed Evaluation

The stripping speed may be evaluated by testing the film strip time. The shorter the film strip time, the faster the film strip speed.

Evaluation of the Size of the Film Strip Fragments 1 substrate after filming, exposing, and developing may be taken, cut into a 5*5 cm square, and put into a beaker containing 100 mL film stripper (concentration 3 wt %, temperature 50° C.). It is magnetically stirred for 1 min, and the size of the film strip fragments is observed.

The evaluation criteria are as follows:

Good: Fragment size 10-20 mm;

Normal: Fragment size 20-30 mm;

Poor: Fragment size above 30 mm or below 5 mm.

Resolution Evaluation

Exposing may be carried out using a mask with a wiring pattern with a width of 1:1 for exposed and unexposed parts. After developing at 1.5 times the minimum development time, the minimum mask width that normally forms a cured resist line may be used as the resolution value, and observing may be performed using a magnifying glass.

Evaluation of Adhesion

A photosensitive dry film resist may be laminated on a copper board by hot-press filming, and exposing may be carried out using a mask with a wiring pattern with a width of n:400 for exposed and unexposed parts. After developing at 1.5 times the minimum development time, the minimum mask width that normally forms a cured resist line may be used as the adhesion value, and observing may be performed using a magnifying glass.

Evaluation of Flexibility

After filming, exposing, and developing, the flexible substrate may be folded 20 times from different angles to observe whether the dry film is cracked, the number of cracks are counted, and a number may be adopted to indicate the result. The smaller the value, the better the flexibility of the dry film.

The evaluation criteria are as follows:

Good: Dry film cracked 0 times after folding;

Normal: Dry film cracked 1-5 times after folding;

Poor: Dry film cracked more than 5 times after folding.

(3) See Table 3 and Table 4 for the evaluation results of adhesion, resolution, film strip speed, and film strip fragment size

TABLE 3

Evaluation results of Examples 1-9 and Comparative Examples 1-2

| Performance | Ex. 1 | Ex. 2 | Ex. 3 | Ex. 4 | Ex. 5 | Ex. 6 | Ex. 7 | Ex. 8 | Ex. 9 | Cp. Ex. 1 | Cp. Ex. 2 |
|---|---|---|---|---|---|---|---|---|---|---|---|
| Adhesion/μm | 27.5 | 27.5 | 27.5 | 27.5 | 25 | 27.5 | 27.5 | 27.5 | 27.5 | 30 | 27.5 |
| Revolution/μm | 27.5 | 27.5 | 27.5 | 27.5 | 27.5 | 27.5 | 27.5 | 27.5 | 27.5 | 27.5 | 27.5 |
| Film strip speed/s | 35 | 37 | 36 | 36 | 31 | 37 | 39 | 26 | 46 | 50 | 25 |
| Film strip fragment size/mm | Good/ 20 | Good/ 20 | Good/ 20 | Good/ 20 | Good/ 15 | Good/ 20 | Good/ 20 | Normal/ 5 | Normal/ 30 | Poor/ 35 | Poor/ 5 |

The weight part of the monomer containing carbonate structure in the photopolymerization monomer in Example 1-9 is in the range of 0.1-15.0. From the comparison between Example 1-9 and Comparative Example 1-2 in Table 3, it can be found that: in Examples 1-7, the film stripping breaks cleanly, the film strip speed is fast, the size of the film strip fragments is moderate, and the resolution and adhesion are good. In Examples 8-9, the adhesion and resolution are better, but the film strip fragments are moderate. In Comparative Example 1, the addition amount of the carbonate structure monomer is 0, resulting in unclean rupture of the film strip, film strip speed is reduced, the size of the film strip fragments is larger, and adhesion is decreased. In Comparative Example 2, the weight of the carbonate structure monomer exceeds 15.0, although it has no obvious effect on the resolution and adhesion performance, the size of the film strip fragments is too small, which is not conducive to the recovery of the film strip fragments, and it is easy to block the pipes and nozzles.

TABLE 4

Evaluation results of Examples 10-18 and Comparative Examples 3-4

| Performance | Ex. 10 | Ex. 11 | Ex. 12 | Ex. 13 | Ex. 14 | Ex. 15 | Ex. 16 | Ex. 17 | Ex. 18 | Cp. Ex. 3 | Cp. Ex. 4 |
|---|---|---|---|---|---|---|---|---|---|---|---|
| Adhesion/μm | 30 | 30 | 30 | 30 | 27.5 | 30 | 30 | 30 | 30 | 30 | 32.5 |
| Revolution/μm | 32.5 | 32.5 | 32.5 | 32.5 | 32.5 | 32.5 | 32.5 | 32.5 | 32.5 | 32.5 | 32.5 |
| Film strip speed/s | 40 | 39 | 40 | 41 | 36 | 38 | 38 | 35 | 36 | 54 | 33 |
| Film strip fragment size/mm | Good/20 | Good/20 | Good/20 | Good/20 | Good/15 | Good/15 | Good/20 | Good/15 | Good/15 | Poor/35 | Poor/<5 |
| Flexibility grade | Good | Good | Good | Good | Good | Good | Good | Good | Good | Poor | Good |

From the comparison of Examples 10-18 and Comparative Examples 3-4, it can be found that the weight of the plasticizer containing carbonate structure in the additives of Example 10-18 is within the range of 0.1-8.0, and the film strip breaks cleanly and the film strip speed is fast; the size of film strip fragments is moderate, and the resolution and adhesion performance are stable, and the flexibility is excellent. In Comparative Example 3, the addition amount of the plasticizer containing carbonate structure is 0, resulting in unclean film strip, the film strip speed is reduced, the size of the film strip fragments is larger, and the flexibility is poor. In Comparative Example 4, the weight of the plasticizer containing carbonate structure exceeds 8.0, although it has no effect on the resolution and adhesion, the size of the film strip fragments is too small, which is not conducive to the recovery and treatment of the film strip fragments, and it is easy to block the pipes and nozzles.

The photosensitive resin composition of the present disclosure comprises a monomer containing carbonate structure and/or a plasticizer containing carbonate structure, the polymer long chain having a carbonate structure is obtained by photopolymerization. When the resin composition is used as a dry film resist, it has excellent flexibility and can quickly react with the strong alkaline sodium hydroxide or potassium hydroxide film strip solution when removing the film, so as to realize breakage of the long chain of the carbonate structure of the polymer or the carbonate structure of the plasticizer, and decomposition to generate carbon dioxide and small molecules, so that the dry film resist swells and breaks, and quickly peels off from the copper board. Therefore, when the photosensitive resin composition of the present disclosure is used as a dry film resist, it has the characteristics such as easy breakage of film strip, smaller film strip fragments, faster film strip speed, excellent flexibility, and good circuit resolution and adhesion, thereby effectively improving production efficiency and product yield.

The description of the above embodiments is only used to help understand the method of the present disclosure and its core concept. It should be pointed out that for those of ordinary skill in the art, without departing from the principle of the present disclosure, several improvements and modifications can be made to the present disclosure, and these improvements and modifications also fall within the protection scope of the claims of the present disclosure.

What is claimed is:

1. A photosensitive resin composition comprising
   40 to 70 parts by weight of an alkali-soluble resin,
   20 to 50 parts by weight of a photopolymerizable monomer,
   0.5 to 10.0 parts by weight of a photoinitiator, and
   0.1 to 10.0 parts by weight of an additive;
   the photopolymerizable monomer comprising 0.5-15.0 parts by weight of a monomer containing a carbonate structure,
   wherein the monomer containing a carbonate structure is one or more of the following three general structures:

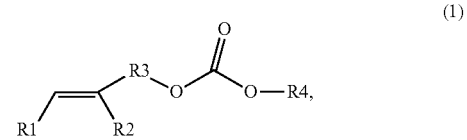

(1)

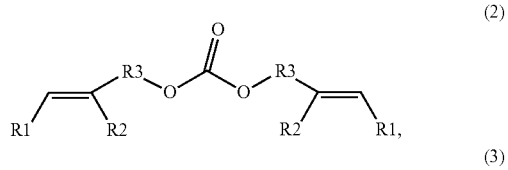

(2)

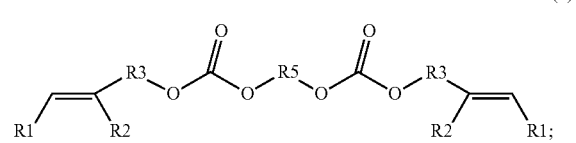

(3)

wherein, in the above general formulas (1), (2) and (3), R1 is hydrogen or phenyl; R2 is hydrogen or methyl; R3 is 1,4-phenylene, or an alkylene group with 1~10 carbon atoms; R4 is a straight or branched chain alkyl group with 1~10 carbon atoms, or an alkenyl group with 2~10 carbon atoms; R5 is selected from a group consisting of a linear or branched alkylene group with 1~10 carbon atoms, an arylene group with 6~10 carbon atoms, or a linear or branched alkylene group with 1~10 carbon atoms in which acyclic —CH2— is optionally substituted by —O—, —S— or 1,4-phenylene, and an arylene group with 6~10 carbon atoms in which acyclic —CH2— is optionally substituted by —O—, —S— or 1,4-phenylene.

2. The photosensitive resin composition according to claim 1, wherein the alkali-soluble resin is formed by copolymerization of at least two of methacrylic acid, methyl (meth)acrylate, ethyl (meth)acrylate, butyl (meth)acrylate, 2-ethylhexyl (meth)acrylate, 2-hydroxyethyl (meth)acrylate, benzyl (meth)acrylate, styrene, and styrene derivatives.

3. The photosensitive resin composition according to claim 1, wherein the alkali-soluble resin has a weight average molecular weight of 20,000 to 150,000, and an acid value of 100 to 350 mg KOH/g.

4. The photosensitive resin composition according to claim 1, wherein the alkali-soluble resin has a weight average molecular weight of 30,000 to 120,000, and an acid value of 120 to 250 mg KOH/g.

5. The photosensitive resin composition according to claim 1, wherein the photopolymerizable monomer contains an ethylenically unsaturated double bond monomer.

6. The photosensitive resin composition according to claim 5, wherein the photopolymerizable monomer comprises one or more selected from a group consisting of lauryl (meth)acrylate, stearyl (meth)acrylate, nonylphenol acrylate, ethoxylated (propoxylated) nonylphenol acrylate, isobornyl ester, tetrahydrofuran methyl acrylate, bisphenol A di(meth)acrylate, ethoxylated (propoxylated) bisphenol A di(meth)acrylate, polyethylene glycol (propylene glycol) di(meth)acrylate, ethoxylated (propoxylated) neopentyl glycol diacrylate, trimethylolpropane tri(meth)acrylate, ethoxylated (propoxylated) trimethylolpropane tri(meth)acrylate, pentaerythritol triacrylate, pentaerythritol tetraacrylate, dipentaerythritol pentaacrylate, and dipentaerythritol hexaacrylate.

7. The photosensitive resin composition according to claim 1, wherein the monomer containing carbonate structure is selected one or more from cinnamyl methyl carbonate, tert-butyl allyl formate, tert-Butyl 4-vinyl phenyl carbonate, allyl methyl carbonate, bis(2-methylallyl) carbonate, and allyl diethylene glycol dicarbonate.

8. The photosensitive resin composition according to claim 1, wherein the photoinitiator is one or more selected from a group consisting of benzoin ether, benzophenone and derivatives thereof, thioxanthone-based compounds, anthraquinone and derivatives thereof, thioxanthone series compounds, and hexaarylbisimidazole series compounds.

9. The photosensitive resin composition according to claim 1, wherein the additives comprise one or more selected from a group consisting of a plasticizer, a defoamer, and a polymerization inhibitor.

10. A photosensitive resin composition comprising 40 to 70 parts by weight of an alkali-soluble resin, 20 to 50 parts by weight of a photopolymerizable monomer, 0.5 to 10.0 parts by weight of a photoinitiator, and 0.1 to 10.0 parts by weight of an additive; the additives comprising 0.1-8.0 parts by weight of a plasticizer containing a carbonate structure; the plasticizer containing a carbonate structure has a structural formula as shown in general formula (4):

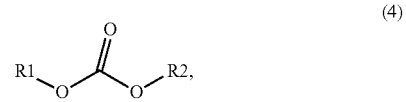

wherein, R1 and R2 are independently selected from C1-C10 linear or branched chain alkyl, C3-C10 cycloalkyl, C4-C10 alkylcycloalkyl or cycloalkylalkyl, phenyl, benzyl, C6-C10 aryl groups, C4-C10 heteroaryl groups, C2-C10 heterocyclic groups, or C2-C20 ester-containing groups; and the acyclic —CH2— in the above groups is capable to be optionally substituted by —O—, —CO—, —NH—, —S— or 1,4-phenylene;

the alkali-soluble resin is formed by copolymerization of at least two of methacrylic acid, methyl (meth)acrylate, ethyl (meth)acrylate, butyl (meth)acrylate, 2-ethylhexyl (meth)acrylate, 2-hydroxyethyl (meth)acrylate, benzyl (meth)acrylate, styrene, and styrene derivatives;

wherein in the general formula (4), R1 and R2 are independently preferably phenyl, benzyl, C6-C10 aryl, C4-C10 heteroaryl, C4-C10 straight chain or branched alkyl groups, the acyclic —CH2— in these groups may be optionally substituted by —O—, —CO—, —NH—, —S— or 1,4-phenylene.

11. The photosensitive resin composition according to claim 10, wherein the alkali-soluble resin has a weight average molecular weight of 20,000 to 150,000, and an acid value of 100 to 350 mg KOH/g.

12. The photosensitive resin composition according to claim 10, wherein the photoinitiator is 2,2',4-tris(2-chlorophenyl)-5-(3,4-dimethoxyphenyl)-4',5'-diphenyl-1,1'-diimidazole.

* * * * *